United States Patent
Kamikubo et al.

[11] Patent Number: 5,892,405
[45] Date of Patent: Apr. 6, 1999

[54] PLL SYNTHESIZER APPARATUS

[75] Inventors: Yasunobu Kamikubo, Kanagawa; Masanobu Onizuka, Tokyo, both of Japan

[73] Assignee: Sony Corporation, Japan

[21] Appl. No.: 845,150

[22] Filed: Apr. 21, 1997

[30] Foreign Application Priority Data

May 20, 1996 [JP] Japan ................................ 8-124301

[51] Int. Cl.⁶ .................................................. H03K 23/00
[52] U.S. Cl. ........................... 331/1 A; 377/48; 377/49; 377/52; 327/115; 327/159; 327/160
[58] Field of Search ................................. 377/48, 49, 52; 331/1 A, 16; 327/105, 107, 115, 159, 160

[56] References Cited

U.S. PATENT DOCUMENTS 4,573,176  2/1986  Yeager ...................................... 377/48
5,712,595  1/1998  Yokoyama ................................ 331/2

*Primary Examiner*—Arnold Kinkead
*Attorney, Agent, or Firm*—Ronald P. Kananen; Rader, Fishman & Grauer

[57] ABSTRACT

Disclosed herein is a fractional N-type PLL frequency synthesizer apparatus. A fractional N-type control circuit employed therein for varying N values for each reference cycle is constructed of a combination of a frequency divider (comprising D flip-flops) and a logic circuit (comprising an exclusive OR circuit, AND circuits and an OR circuit), taking the timing provided to output a carry signal into consideration in advance. Owing to such a construction, the fractional N-type PLL frequency synthesizer apparatus can be activated with low noise and can provide a short lockup time.

4 Claims, 8 Drawing Sheets

PLL SYNTHESIZER APPARATUS

BACKGROUND OF THE INVENTION

1. Field of the Invention

The present invention relates to a control circuit suitable for a PLL (Phase Locked Loop) frequency synthesizer apparatus, and particularly to a control circuit for varying frequency-divided values (N values) every reference cycles, which is suitable for use in a fractional N (Fractional Number)-type PLL frequency synthesizer apparatus.

2. Description of the Related Art

A fractional N-type PLL frequency synthesizer apparatus features that since it can set a division ratio for fractional values or numbers, a reference frequency can be set to twice by a natural number as large as a frequency step desired to be changed and correspondingly the time constant of a loop filter can be reduced, thereby making it possible to provide high-speed lockup and low noise (high C/N). The fractional N-type PLL frequency synthesizer apparatus is provided with a control circuit (hereinafter called "fractional N-type control circuit") for changing N values every reference cycles.

A related art of the fractional N-type control circuit will be shown in FIG. 1. In the same drawing, 2-bit frequency-divided value (N value) data (A, B) are respectively supplied to terminals 1 and 2, a clear signal is supplied to a terminal 3 and a reference clock having a frequency of 1.2 MHz, for example, is supplied to a terminal 4. The terminals 1 and 2 are respectively electrically connected to one addition input (A2) terminals of adders 5 and 6. A carry output (CO) terminal of the adder 5 is electrically connected to a carry input (CI) terminal of the adder 6. A carry output (CO) terminal of the adder 6 is electrically connected to a carry output terminal 7.

An addition output (S) terminal of the adder 5 is electrically connected to a data (D) input terminal of a D flip-flop 8. A Q output terminal of the D flip-flop 8 is electrically connected to the other addition input (A1) terminal of the adder 5. An addition output (S) terminal of the adder 6 is electrically connected to a data (D) input terminal of a D flip-flop 9. A Q output terminal of the D flip-flop 9 is electrically connected to the other addition input (A1) terminal of the adder 6. Respective clear (CL) input terminals of the D flip-flops 8 and 9 are electrically connected to the terminal 3 and clock (CK) input terminals thereof are electrically connected to the terminal 4.

In the fractional N-type control circuit constructed as described above, a carry signal is supplied to a PLL swallow counter (not shown) as an N+1 signal through the carry output terminal 7. When the 2-bit frequency-divided value data (A, B) are respectively (0, 0), (1,0), (0, 1) and (1, 1), for example, their frequency-divided values are respectively set to 0, ¼, 2/4 and ¾. When the frequency-divided value is ¼, N+1 is supplied or given once every four reference cycles. When the frequency-divided value is 2/4, N+1 is given twice every four reference cycles. When the frequency-divided value is ¾, N+1 is given three times every four reference cycles.

The operation of the fractional N-type control circuit at the time that the frequency-divided value is ¼, will now be explained as an example by the following example in which a channel interval is 300 kHz. If a one channel shift occurs when a given channel is defined as N (kHz), then the channel interval becomes N+300 (kHz). If a reference frequency is set to 300 (kHz) at this time, then a PLL can be easily constructed. Since, however, the reference cycle is long, time is required until the PLL is locked. Thus, if the reference frequency is set to 1.2 MHz corresponding to four times the frequency of 300 kHz, for example, then the reference cycle is brought to ¼. Therefore, the PLL is locked fast as compared with when the reference frequency is 300 (kHz).

As described above, the PLL using 1.2 MHz is locked once per four reference cycles with a frequency large by one reference frequency. Namely, the count of the swallow counter is incremented by 1 once per four reference cycles. In doing so, the PLL is brought to (N+N+N+1.2 MHz)/4=N+300 kHz on the average. Thus, the fractional N-type is intended to construct the PLL in which a quick-response frequency is defined as the reference frequency and lock the PLL to a desired frequency by incrementing the count of the swallow counter by 1 n times per m reference cycles.

Since, however, the related art fractional N-type control circuit uses the adders 5 and 6 and has a fedback circuit configuration, the low noise (high C/N) and high-speed lockup characteristics of the fractional N-type PLL frequency synthesizer apparatus are impaired and a relatively high frequency is supplied to the entire circuit for the sake of feedback control. As a result, a problem arises that the current to be used up by the entire PLL unit increases.

OBJECT AND SUMMARY OF THE INVENTION

With the foregoing in view, it is an object of the present invention to provide a control circuit suitable for use in a fractional PLL frequency synthesizer apparatus, which is capable of realizing less current consumption without impairing low-noise (high C/N) and high-speed lock-up characteristics of the fractional N type.

According to one aspect of the present invention, for achieving the above object, there is provided a control circuit suitable for a PLL frequency synthesizer apparatus, for changing frequency-divided values for each cycle of a reference clock having a predetermined frequency, comprising:

a frequency divider for dividing the reference clock by a predetermined division ratio; and an arithmetic circuit for outputting a carry signal for varying the frequency-divided values in response to data for setting an m (where m: natural number) value determined by both the frequency of the reference clock and a channel interval and a frequency-divided output produced from the frequency divider, said data and frequency-divided output being supplied thereto.

In the control circuit having the above-described construction, the frequency divider generates a clock obtained by ½-dividing the reference clock and a clock (i.e., a clock obtained by ¼-dividing the reference clock) obtained by further ½-dividing this clock when m =4, for example. The arithmetic circuit performs an arithmetic operation on 2-bit data for setting the m (=4) value and the ½ and ¼-divided clocks to thereby output a carry signal for varying frequency-divided values for each cycle of the reference clock.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will now be described with reference to the accompanying drawings wherein.

DETAILED DESCRIPTION OF THE PREFERRED EMBODIMENTS

Figure 2:
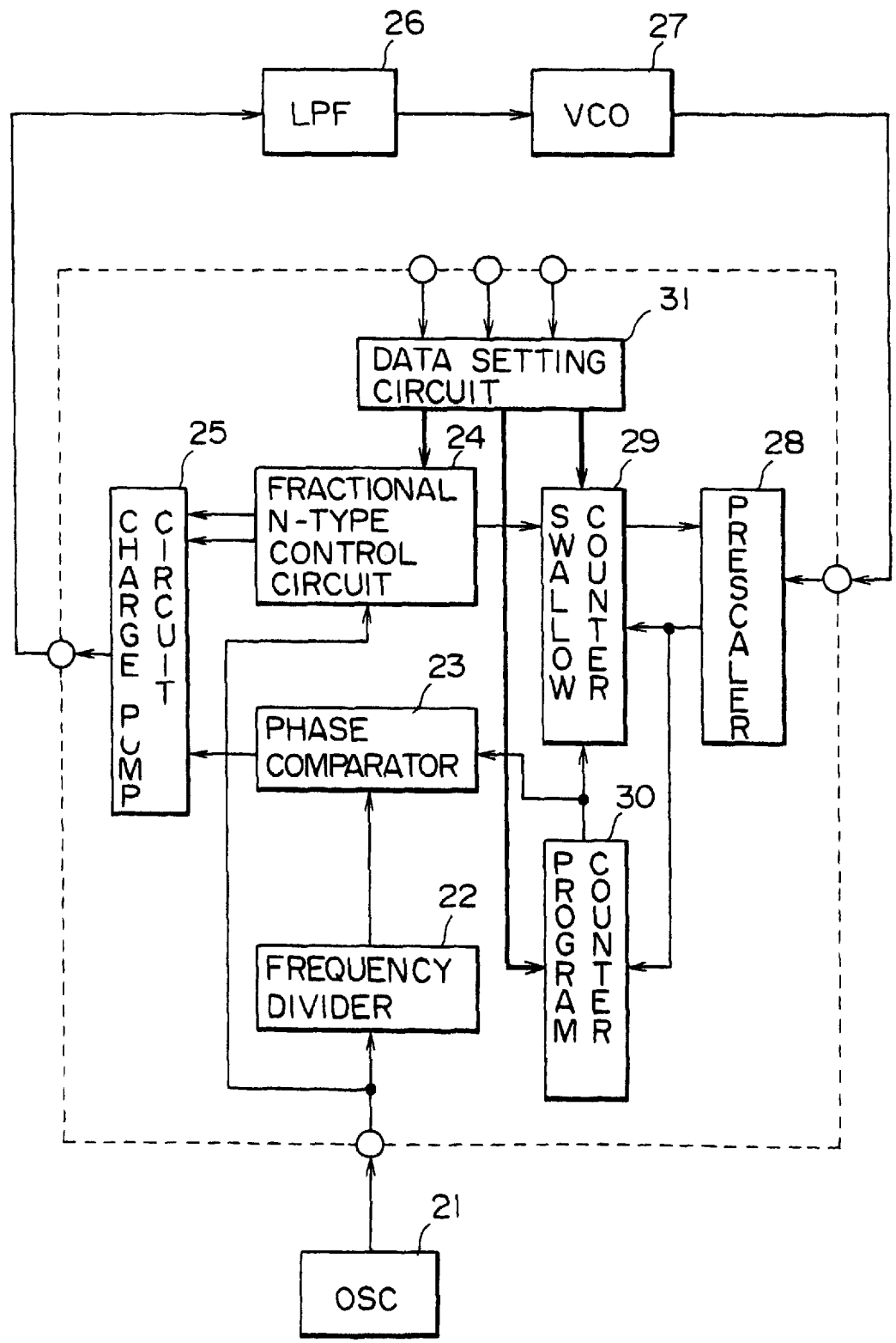
FIG. 2 is a system block diagram illustrating a basic configuration of a fractional N-type PLL frequency synthesizer apparatus.

Preferred embodiments of the present invention will hereinafter be described in detail with reference to the accompanying drawings. A fractional N-type PLL frequency synthesizer apparatus will first be described. FIG. 2 is a system block diagram showing a basic configuration of the fractional N-type PLL frequency synthesizer apparatus.

Referring to FIG. 2, an oscillator (OSC) 21 generates a reference clock having a frequency of 1.2 MHz, for example. The generated reference clock is frequency-divided by a frequency divider 22 so as to be one input of a phase comparator 23 and is supplied to a fractional N-type control circuit 24. A compared output produced from the phase comparator 23 is supplied to a charge pump circuit 25. The charge pump circuit 25 outputs a current having a magnitude pulse-width modulated based on the phase-difference information outputted from the phase comparator 23. The output current is smoothed by a low-pass filter (LPF) 26, followed by supply to a voltage-controlled oscillator (VCO) 27 as a d.c. control voltage therefor.

The voltage-controlled oscillator 27 changes its oscillation frequency in response to the d.c. control voltage supplied from the low-pass filter 26. The oscillation frequency is divided by a predetermined division ratio by a prescaler 28, followed by supply to a swallow counter 29 and a program counter 30. A count output of the program counter 30 is supplied to the swallow counter 29 and is used as the other input of the phase comparator 23. The phase comparator 23 compares the phase between the output frequency of the frequency divider 22 and the output frequency of the program counter 30 and supplies information about the phase difference between them to the charge pump circuit 25.

A data setting circuit 31 sets various data to each of the fractional N-type control circuit 24, the swallow counter 29 and the program counter 30. For example, 2-bit frequency-divided value (N value) data (A, B) are supplied to the fractional N-type control circuit 24. Further, 5-bit swallow counter set data is supplied to the swallow counter 29, whereas 1-bit channel set data is supplied to the program counter 30.

The fractional N-type control circuit 24 generates an N+1 signal (carry signal) for each period, i.e., reference cycle of the reference clock supplied from the oscillator 21, based on the frequency-divided value data (A, B) supplied from the data setting circuit 31 and supplies it to the swallow counter 29. When the N+1 signal supplied from the fractional N-type control circuit 24 is of an "H" level, the swallow counter 29 increases its frequency-divided value (N value) by 1.

Figure 3:
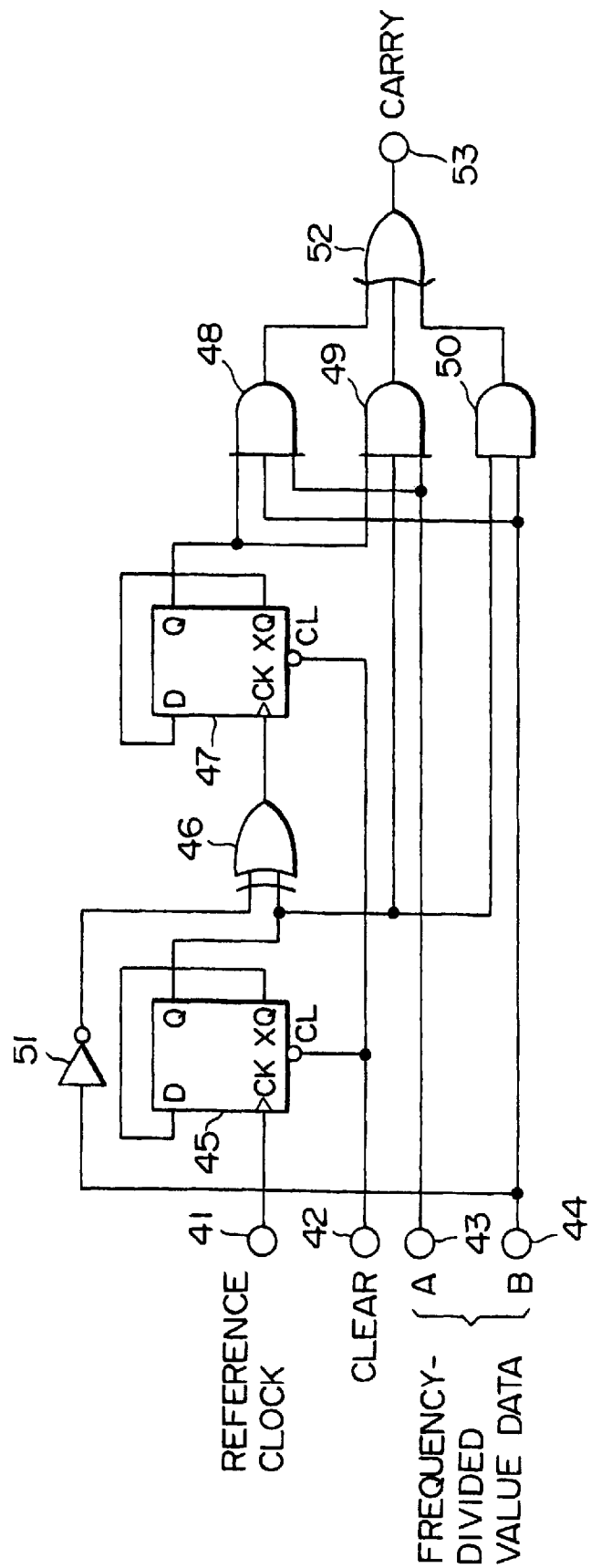
FIG. 3 is a block diagram depicting a fractional N-type control circuit according to one embodiment of the present invention.

FIG. 3 is a block diagram showing one embodiment of the fractional N-type control circuit 24 according to the present invention. In the present embodiment, a circuit configuration is adopted as an example, in which the frequency of the reference clock is set to 1.2 MHz, a channel interval (frequency step) is set to 300 kHz and the number of times that the N value is changed for each reference cycle, is set to four ways (m=1.2 MHz/300 kHz) according to the 2-bit frequency-divided value data (A, B).

Referring to FIG. 3, a reference clock, a clear signal and 2-bit frequency-divided value (N value) data are supplied to a terminal 41, a terminal 42, and terminals 43 and 44 respectively. The terminal 41 is electrically connected to a clock (CK) input terminal of a D flip-flop 45. A Q output terminal of the D flip-flop 45 is electrically connected to respective input terminals of a two-input exclusive OR (EX-OR) circuit 46, a three-input logical product (AND) circuit 49 and a two-input logical product circuit 50, whereas an XQ output terminal thereof is electrically connected to a data (D) input terminal thereof.

An output terminal of the two-input EX-OR circuit 46 is electrically connected to a clock (CK) input terminal of a D flip-flop 47. A Q output terminal of the D flip-flop 47 is electrically connected to one input terminal of a three-input AND circuit 48 and the other input terminal of the three-input AND circuit 49. An XQ output terminal of the D flip-flop 47 is electrically connected to a data (D) input terminal thereof. The terminal 42 is electrically connected to respective clear (CL) input terminals of the D flip-flops 45 and 47. The terminal 43 is electrically connected to the other input terminal of the three-input AND circuit 48 and the remaining one input terminal of the three-input AND circuit 49.

The terminal 44 is electrically connected to the remaining one input terminal of the three-input AND circuit 48, the other input terminal of the two-input AND circuit 50 and an input terminal of an inverter 51. An output terminal of the inverter 51 is electrically connected to the other input terminal of the two-input EX-OR circuit 46. Respective output terminals of the three-input AND circuits 48 and 49 and the two-input AND circuit 50 are respectively electrically connected to three input terminals of a three-input logical sum (OR) circuit 52. An output terminal of the three-input OR circuit 52 is electrically connected to an output terminal 53.

Figure 1:
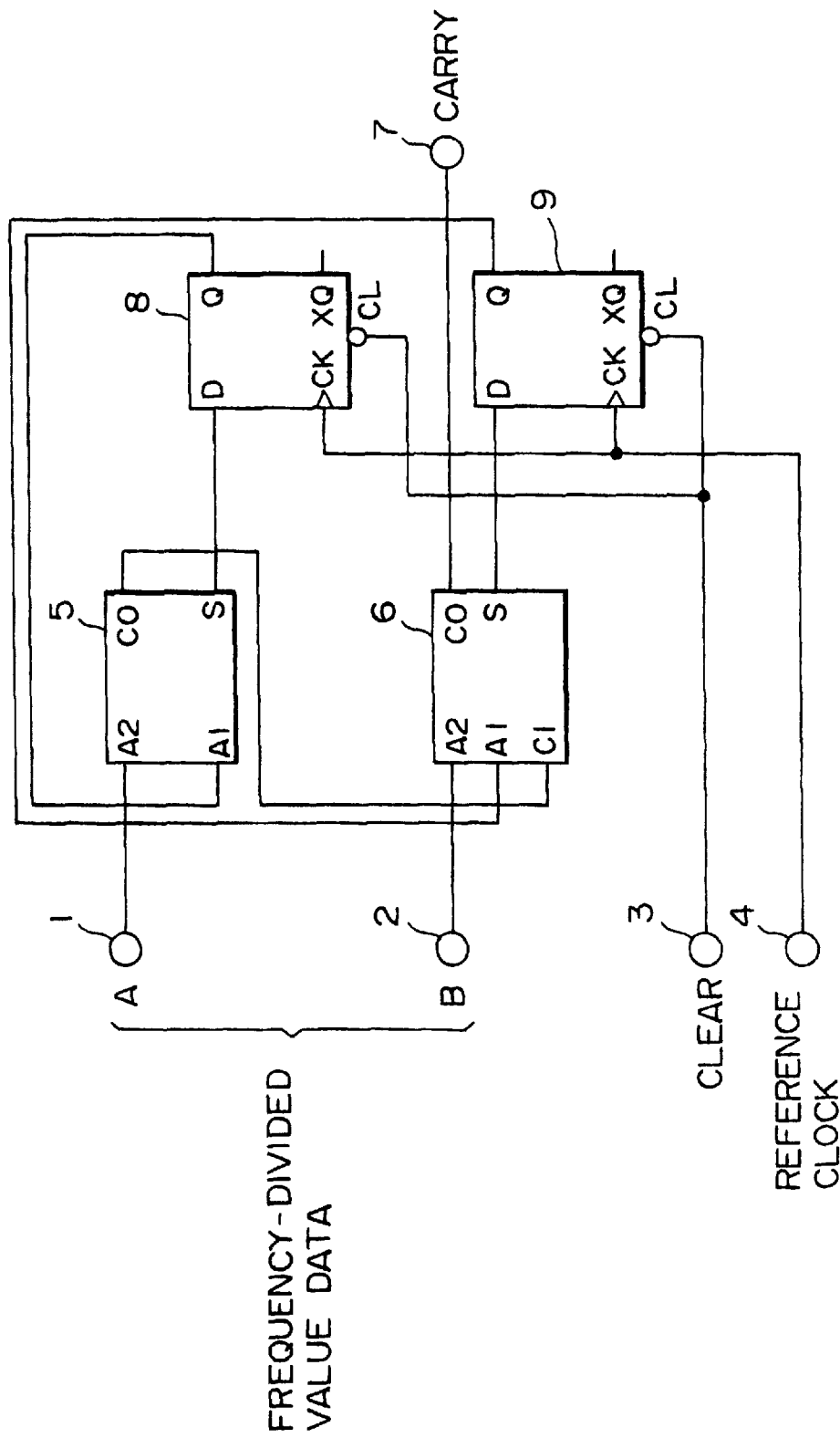
FIG. 1 is a diagram showing a fractional N-type control circuit according to the related art.
Figure 4A:
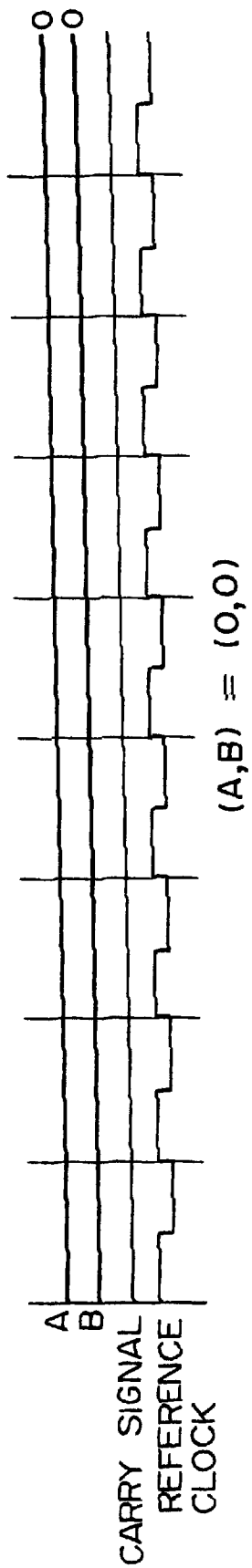
FIGS. 4A and 4B are timing charts (No. 1) for describing the number of times that a carry signal shown in FIG. 3 is generated.
Figure 4B:
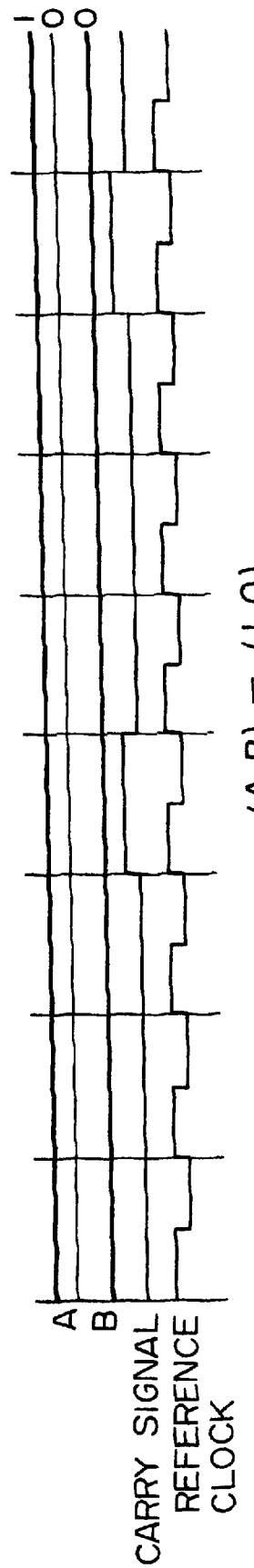
Figure 5A:
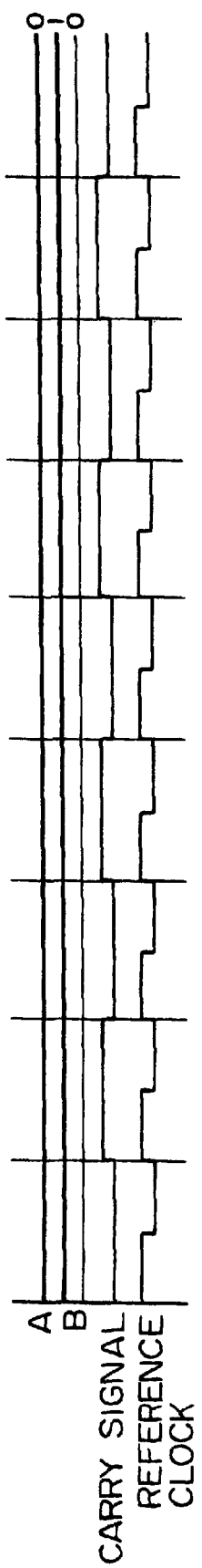
FIGS. 5A and 5B are timing charts (No. 2) for describing the number of times that the carry signal shown generated.
Figure 5B:
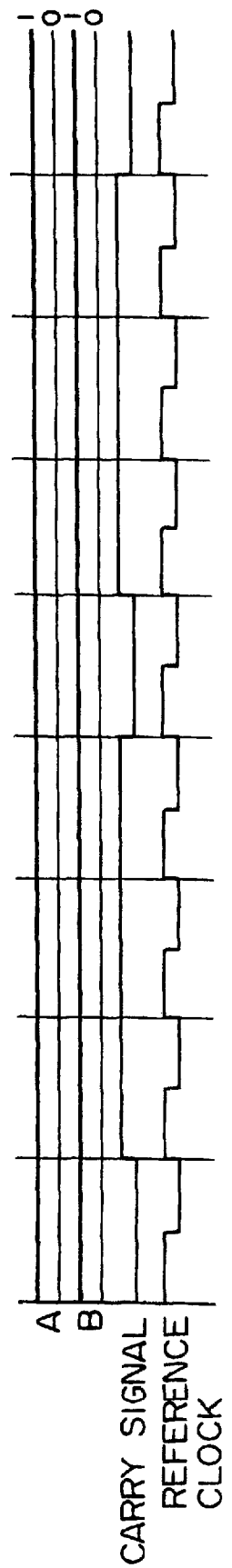

The fractional N-type control circuit 24 according to the present embodiment constructed as described above has a ¼ division circuit configuration. According to the 2-bit frequency-divided value data (A, B), the number of times that the carry signal (N+1 signal) is produced, can be set to 0 (see FIG. 4A), 1 (see FIG. 4B) per four cycles, 1 (see FIG. 5A) per two cycles, and 3 (see FIG. 5B) per four cycles. However, the time required to produce the carry signal once corresponds to one period, i.e., the reference cycle of the frequency of the reference clock. When the carry signal is outputted from the fractional N-type control circuit 24, the swallow counter 9 shown in FIG. 1 is incremented by one in response to the carry signal.

Figure 6:
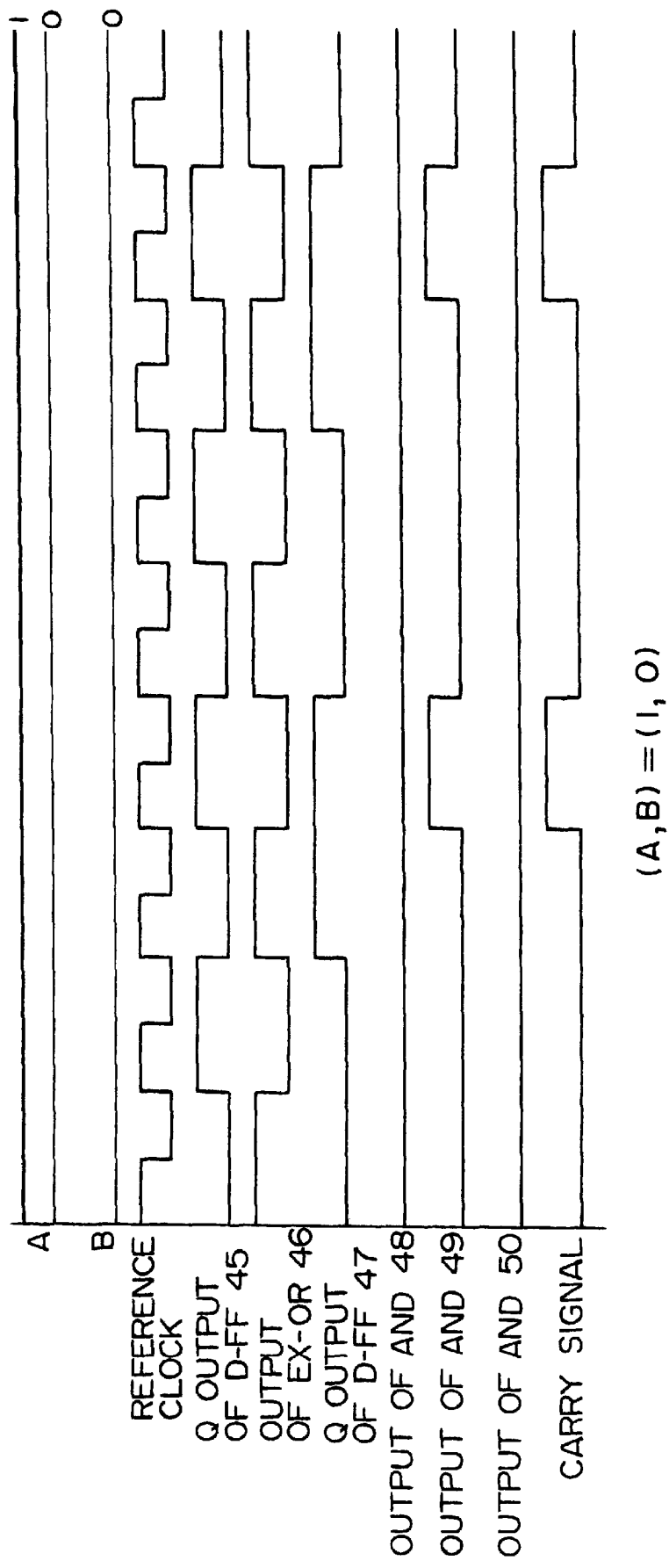
FIG. 6 is a timing chart for explaining an operation of the fractional N-type control circuit at the time that frequency-divided value data (A, B)=(1, 0)
Figure 7:
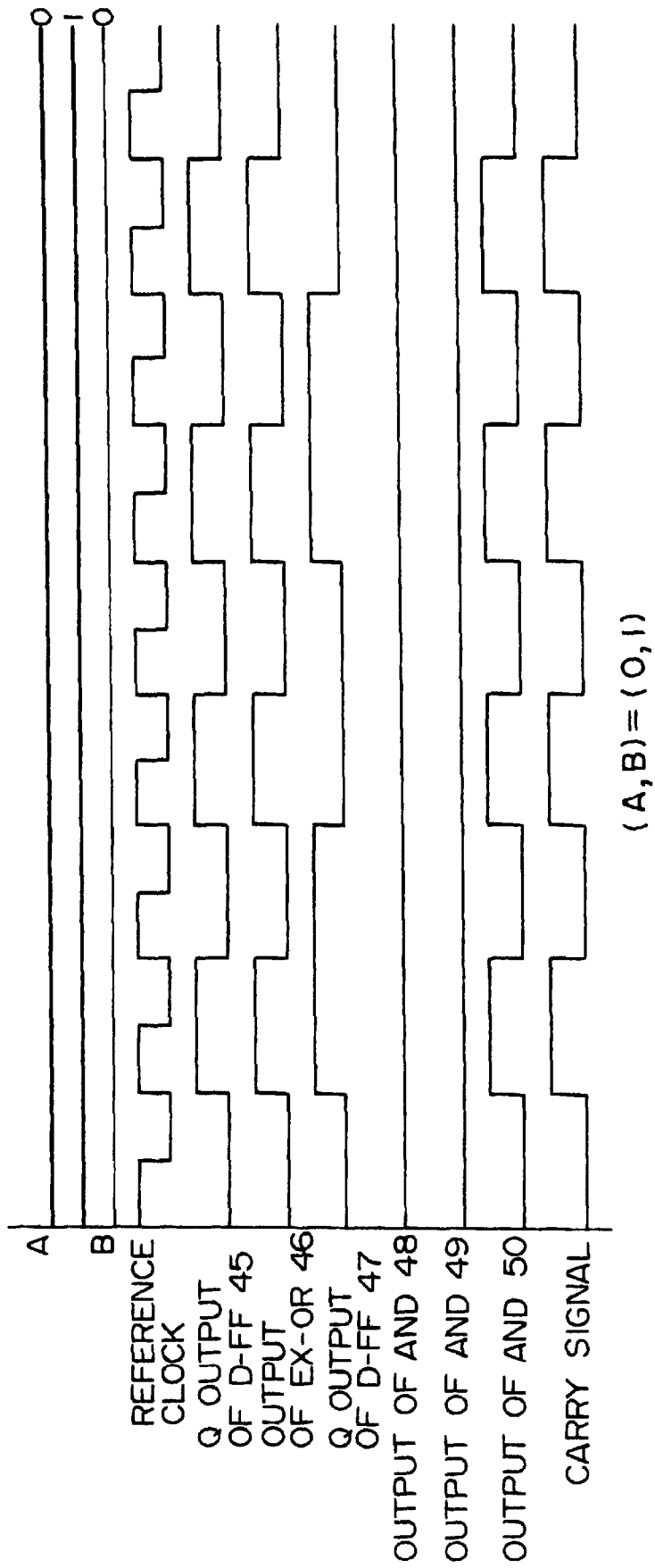
FIG. 7 is a timing chart for explaining another operation of the fractional N-type control circuit at the time that the frequency-divided value data (A, B)=(0, 1)
Figure 8:
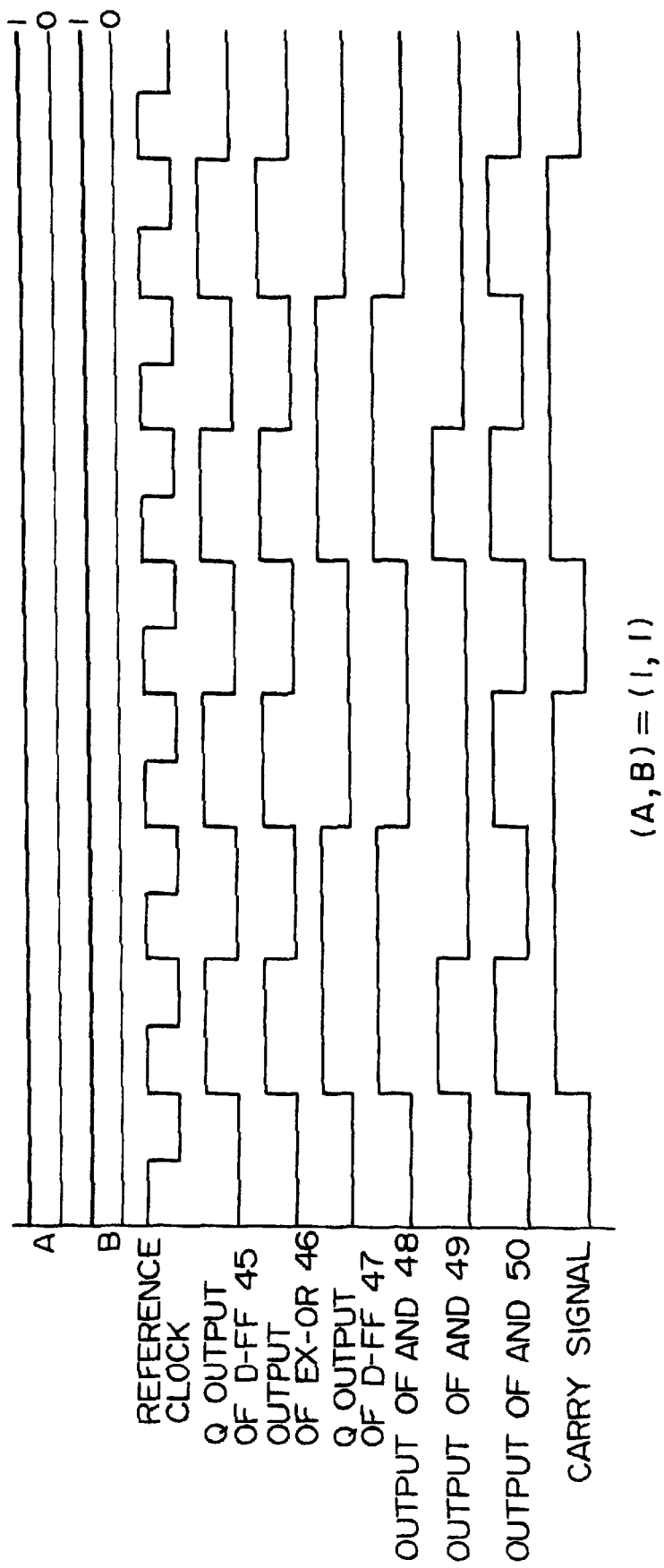
FIG. 8 is a timing chart for explaining a further operation of the fractional N-type control circuit at the time that the frequency-divided value data (A, B)=(1, 1).

Specific circuit operations of the fractional N-type control circuit shown in FIG. 3 will next be described based on timing charts shown in FIGS. 6 through 8. When the frequency-divided value data (A, B) are respectively expressed as (0, 0), each of the AND circuits 48 through 50 first receives the frequency-divided value data A or B therein as one input. Since at least one input is of an "L" level, all the AND circuits 48 through 50 are kept in gate-cutoff states and hence no carry signal is outputted from the fractional N-type control circuit 24. Namely, the number of times that the carry signal is produced, is 0 as is apparent from FIG. 4A.

The operation of the fractional N-type control circuit 24 at the time that the frequency-divided value data (A, B) are respectively equal to (1, 0), will next be explained with reference to the timing chart shown in FIG. 6. When the D flip-flop (D-FF) 45 receives a reference clock having a frequency of 1.2 MHz therein as a clock (CK) input, a Q output of the D flip-flop 45 is brought to a clock having a frequency (600 kHz) corresponding to ½ the frequency of the reference clock. Namely, the D flip-flop 45 serves as a ½ frequency divider. Since the frequency-divided value data B is now 0, the output of the exclusive OR (EX-OR) circuit 46 is brought to a clock whose phase is opposite to that of the Q output of the D flip-flop 45.

When the D flip-flop 47 receives the output of the exclusive OR circuit 46 therein as a clock input, a Q output produced from the D flip-flop 47 is brought to a clock having a frequency corresponding to one-half the frequency of the output of the exclusive OR circuit 46. Namely, the D flip-flop circuit 47 also serves as a ½ frequency divider. As a result, the Q output of the D flip-flop 47 is brought to a clock having a frequency (300 kHz) corresponding to ¼ the frequency of the reference clock. Since the frequency-divided value data B is 0 here, the AND circuits 48 and 50 are both in the gate-cutoff states.

On the other hand, since the frequency-divided value data A is 1, the AND circuit 49 ANDs the frequency-divided value data A, the Q output of the D flip-flop 45 and the Q output of the D flip-flop 47. Only the output of the AND circuit 49 passes through the OR circuit 53 and is outputted as a carry signal. As a result, the number of times that the carry signal is produced, becomes one per four reference cycles as is apparent from FIG. 4B.

The operation of the fractional N-type control circuit 24 at the time that the frequency-divided value data (A, B) are respectively equal to (0, 1), will next be described with reference to the timing chart shown in FIG. 7. When the D flip-flop 45 serves as the ½ frequency divider and receives a reference clock therein as a clock input, the Q output of the D flip-flop 45 is brought to a clock having a frequency corresponding to half the frequency of the reference clock. Since the frequency-divided value data B is now 1, the output of the exclusive OR circuit 46 is brought to a clock in phase with the Q output of the D flip-flop 45.

When the D flip-flop 47 also serves as the ½ frequency divider and receives the output of the exclusive OR circuit 46 therein as a clock input, the Q output of the D flip-flop 47 is brought to a clock having a frequency corresponding to half the frequency of the output of the exclusive OR circuit 46. As a result, the Q output of the D flip-flop 47 becomes a clock having a frequency corresponding to ¼ the frequency of the reference clock. Since the frequency-divided value data A is 0 here, the AND circuits 48 and 49 are both in the gate-cutoff states.

On the other hand, since the frequency-divided value data B is 1, the AND circuit 50 ANDs the frequency-divided value data B and the Q output of the D flip-flop 45. Only the output of the AND circuit 50 passes through the OR circuit 52 and is outputted as a carry signal. As a result, the number of times that the carry signal is generated, becomes 2 per four reference cycles as is apparent from FIG. 5A.

The operation of the fractional N-type control circuit 24 at the time that the frequency-divided value data (A, B) are respectively equal to (1, 1), will finally be explained with reference to the timing chart shown in FIG. 8. When the D flip-flop 45 serves as the ½ frequency divider and receives a reference clock therein as a clock input, the Q output of the D flip-flop 45 is brought to a clock having a frequency corresponding to half the frequency of the reference clock. Since the frequency-divided value data B is now 1, the output of the exclusive OR circuit 46 becomes a clock in phase with the Q output of the D flip-flop 45.

When the D flip-flop 47 also serves as the ½ frequency divider and receives the output of the exclusive OR circuit 46 therein as a clock input, the Q output of the D flip-flop 47 becomes a clock having a frequency corresponding to half the frequency of the output of the exclusive OR circuit 46. As a result, the Q output of the D flip-flop 47 is brought to a clock having a frequency corresponding to ¼ the frequency of the reference clock. Since the frequency-divided value data A and B are both equal to 1 here, the AND circuit 48 ANDs the frequency-divided value data A and B and the Q output of the D flip-flop 47.

The AND circuit 49 ANDs the frequency-divided value data A, the Q output of the D flip-flop 45 and the Q output of the D flip-flop 47. Further, the AND circuit 50 ANDs the frequency-divided value data B and the Q output of the D flip-flop 45. The ORing of the respective outputs of the AND circuits 48 through 50 is performed by the OR circuit 52 and the result of ORing becomes a carry signal. As a result, the number of times that the carry signal is generated, becomes 3 per four reference cycles as is apparent from FIG. 5B.

As described above, since the fractional N-type control circuit 24 for changing the N values every reference cycles is constructed of a combination of a frequency divider (comprising D flip-flops 45 and 47) and a logical circuit (comprising exclusive OR circuit 46, AND circuits 48 through 50 and OR circuit 52) in consideration of the timing provided to output the carry signal, in advance, the frequency supplied to the entire circuit is relatively lowered as compared with the related art circuit for the feedback control (see FIG. 1).

Thus, the PLL unit can provide less current consumption without impairment of low noise (high C/N) and high-speed lockup characteristics of the fractional N type. Further, the delay from the reference clock can be minimized. A comparison between operating speeds of the related art circuit (A) and the circuit (B) of the present invention will be shown in Table 1.

TABLE 1

|  | 1.2M—>600K | 600K—>300K | 660K/300K—>Carry |
| --- | --- | --- | --- |
| CIRCUIT OF RELATED ART (A) | 524.8 | 524.8 | 527.13 |
| CIRCUIT OF PRESENT INVENTION (B) | 2.73 | 7.29 | 6.42 |
| A/B | 192.23 | 72.0 | 82.1 |

UNIT (ns)

Since the PLL unit can provide less current consumption, a waiting time is prolonged if an IC equipped with the circuit of the present invention is built in a set. Further, since the low noise (high C/N) can be maintained, communication errors and errors in communication become hard to occur.

The aforementioned embodiment has described the circuit configuration in which the frequency of the reference clock is set to 1.2 MHz, the channel interval is set to 300 kHz and the number of times that the N value is changed for each reference cycle, is set to four according to the 2-bit frequency-divided value data (A, B). However, the present invention is not necessarily limited to this. It is apparent that the frequency of the reference clock and the number of bits representative of the frequency-divided value data can be respectively set arbitrarily and correspondingly, the fractional N-type control circuit 24 is also changed in circuit configuration.

In the fractional N-type PLL frequency synthesizer apparatus as described above, the PLL can be quickly locked onto a desired frequency by changing the frequency-divided values, utilizing the respective bits for the frequency-divided value data of the fractional N-type control circuit 24 in combination or by changing the frequency of the reference clock.

According to the present invention as has been described above, since the control circuit for varying the N values every reference cycles, which is suitable for use in the fractional N-type PLL frequency synthesizer apparatus, is constructed of the combination of the frequency divider and the logical circuit, the frequency routed to the entire circuit is relatively lowered as compared with the related art circuit for the feedback control. Therefore, the PLL unit can provide less current consumption without impairment of the low noise (high C/N) and high-speed lockup characteristics of the fractional N type and the delay from the reference clock can be minimized.

While the present invention has been described with reference to the illustrative embodiment, this description is not intended to be construed in a limiting sense. Various modifications of the illustrative embodiment of the invention, will be apparent to those skilled in the art on reference to this description. It is therefore contemplated that the appended claims will cover any such modifications or embodiments as fall within the true scope of the invention.

What is claimed is:

1. A control circuit suitable for a PLL frequency synthesizer apparatus for changing frequency-divided values for each cycle of a reference clock having a predetermined frequency, comprising:

a frequency divider for dividing the reference clock by a predetermined division ratio;

an arithmetic circuit for outputting a carry signal for varying the frequency-divided values in response to data for setting an m (where m: natural number) value determined by both the frequency of the reference clock, and a channel interval and a frequency-divided output produced from said frequency divider, said data and frequency-divided output being supplied thereto, wherein when the m value is set by 2-bit data, said frequency divider comprises a first flip-flop for frequency-dividing the reference clock, a selection circuit for receiving the output of said first flip-flop and data obtained by inverting the low-order bit of the 2-bit data therein as two inputs, and a second flip-flop for further frequency-dividing the output of said selection circuit, and said arithmetic circuit comprises a first logic circuit for accepting the 2-bit data and the output of said second flip-flop therein as three inputs, a second logic circuit for accepting the high-order bit of the 2-bit data and the respective outputs of said first and second flip-flops therein as three inputs, a third logic circuit for receiving the high-order bit of the 2-bit data and the output of said first flip-flop therein as two inputs, and a fourth logic circuit for receiving the respective outputs of said first, second and third logic circuits therein as three inputs.

2. A control circuit according to claim 1, wherein said selection circuit comprises an exclusive OR circuit.

3. A control circuit according to claim 1, wherein said first, second and third logic circuits are respectively composed of AND circuits and said fourth logic circuit comprises an OR circuit.

4. A control circuit according to claim 1, wherein the m value is set to 4 and ¼-divided by said first and second flip-flops.

* * * * *